(12) United States Patent
Leib et al.

(10) Patent No.: US 8,324,024 B2
(45) Date of Patent: Dec. 4, 2012

(54) METHOD FOR PRODUCTION OF PACKAGED ELECTRONIC COMPONENTS, AND A PACKAGED ELECTRONIC COMPONENT

(75) Inventors: Juergen Leib, Freising (DE); Dietrich Mund, Obersuessbach (DE)

(73) Assignee: Schott AG (DE)

( * ) Notice: Subject to any disclaimer, the term of this patent is extended or adjusted under 35 U.S.C. 154(b) by 737 days.

(21) Appl. No.: 11/911,085

(22) PCT Filed: Apr. 10, 2006

(86) PCT No.: PCT/EP2006/003247
§ 371 (c)(1),
(2), (4) Date: Sep. 4, 2009

(87) PCT Pub. No.: WO2006/108588
PCT Pub. Date: Oct. 19, 2006

(65) Prior Publication Data
US 2009/0321867 A1    Dec. 31, 2009

(30) Foreign Application Priority Data
Apr. 11, 2005  (DE) .......................... 10 2005 016 751

(51) Int. Cl.
*H01L 21/00* (2006.01)
(52) U.S. Cl. ........ 438/110; 438/109; 257/704; 257/686; 257/723; 257/685
(58) Field of Classification Search ........... 257/704, 257/778, 686, 723, 731, 732, 733, 779, 780, 257/781, 782, 783, 784, 786, 678, 685, 688, 257/690; 438/110, 109, 111, 113, 114, 121, 438/125, 106, 108, 118, 119, 65
See application file for complete search history.

(56) References Cited

U.S. PATENT DOCUMENTS

| | | | |
|---|---|---|---|
| 5,081,520 A | 1/1992 | Yoshii et al. | |
| 7,422,962 B2 * | 9/2008 | Chen et al. | 438/456 |
| 7,524,427 B2 * | 4/2009 | Cohen et al. | 216/2 |
| 2002/0113296 A1 | 8/2002 | Cho et al. | |

(Continued)

FOREIGN PATENT DOCUMENTS

CN    1581501 A    2/2005

(Continued)

OTHER PUBLICATIONS

"Chinese Patent Application 200680011771.4 Office Action", May 8, 2009, Publisher: The Patent Office of the People's Republic of China, Published in: CN.

(Continued)

*Primary Examiner* — Ha Tran T Nguyen
*Assistant Examiner* — Thanh Y Tran
(74) *Attorney, Agent, or Firm* — Kaplan Breyer Schwarz & Ottesen, LLP

(57) ABSTRACT

The invention relates to a method for production of packaged electronic, in particular optoelectronic, components in a composite wafer, in which the packaging is carried out by fitting microframe structures of a cover substrate composed of glass, and the composite wafer is broken up along trenches which are produced in the cover substrate, and to packaged electronic components which can be produced using this method, comprising a composite of a mount substrate and a cover substrate, with at least one functional element and at least one bonding element, which makes contact with the functional element, being arranged on the mount substrate, with the cover substrate being a microstructured glass which is arranged on the mount substrate, and forms a cavity above the functional element, and with the bonding elements being located outside the cavity.

21 Claims, 17 Drawing Sheets

U.S. PATENT DOCUMENTS

Figure 12:
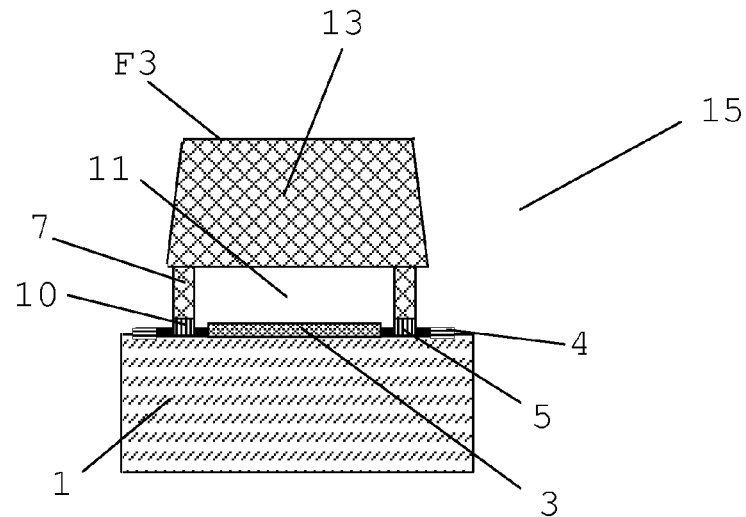

2004/0029360 A1    2/2004    Geefay et al.

FOREIGN PATENT DOCUMENTS

EP    1 445 803 A2    8/2004
EP    1 503 420 A2    2/2005

OTHER PUBLICATIONS

Frank Tinjod, "International Patent Application No. PCT/EP2006/003247 'Inernational Preliminary Report on Patentability'", Jun. 29, 2007, Publisher: PCT, Published in: NL.

Mund D et al, "Novel microstructuring technology for glass on silicon and glass-substrates", Electronic components and technology, 2004, ECTC '04, Proceedings Las Vegas, NV, USA Jun. 1-4, 2004, Piscataway, NJ, USA, IEEE, vol. 1, Jun. 1, 2004, pp. 939-942 XP010714654.

Leib J et al, "New wafer-level-packaging technology using silicon-via-contacts for optical and other sensor applications", Electronic Components and Technology, 2004 ECTC '04, Proceedings Las Vegas, NV, USA Jun. 1-4, 2004, Piscataway, NJ, USA, IEEE, vol. 1, Jun. 1, 2004, pp. 843-847, XP010714585.

* cited by examiner

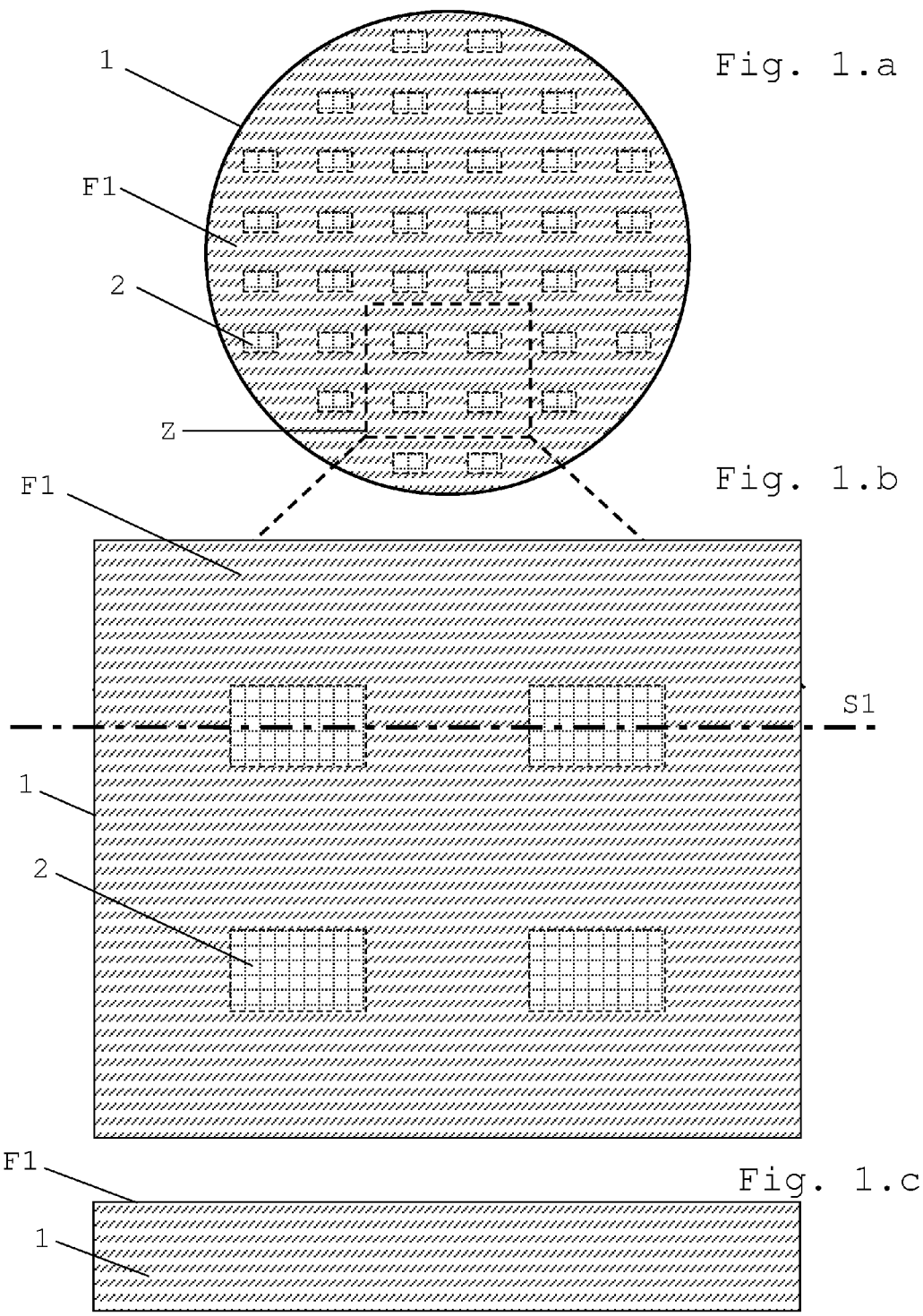

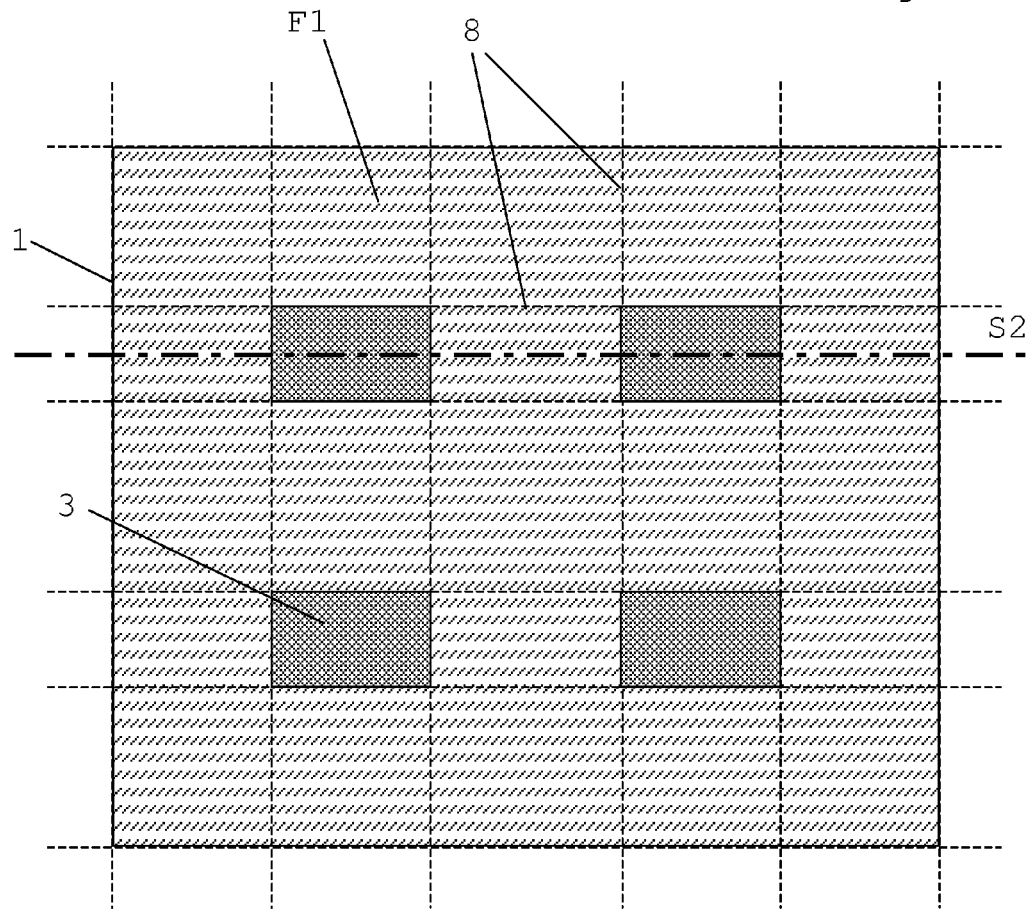
Fig. 2.a
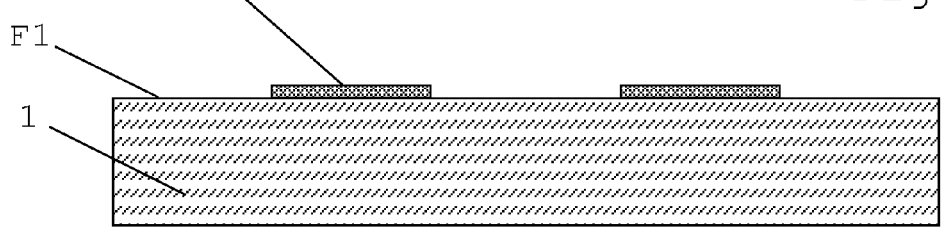
Fig. 2.b

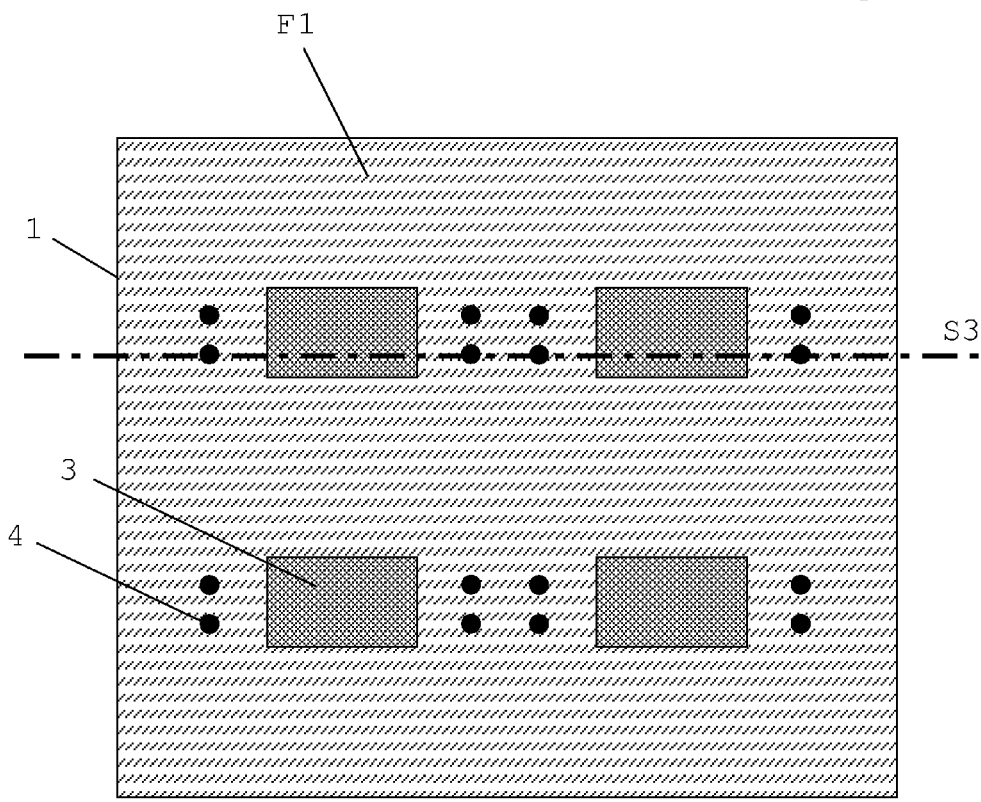
Fig. 3.a
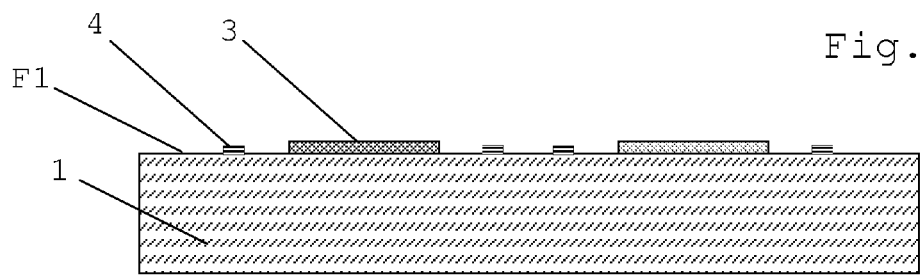
Fig. 3.b

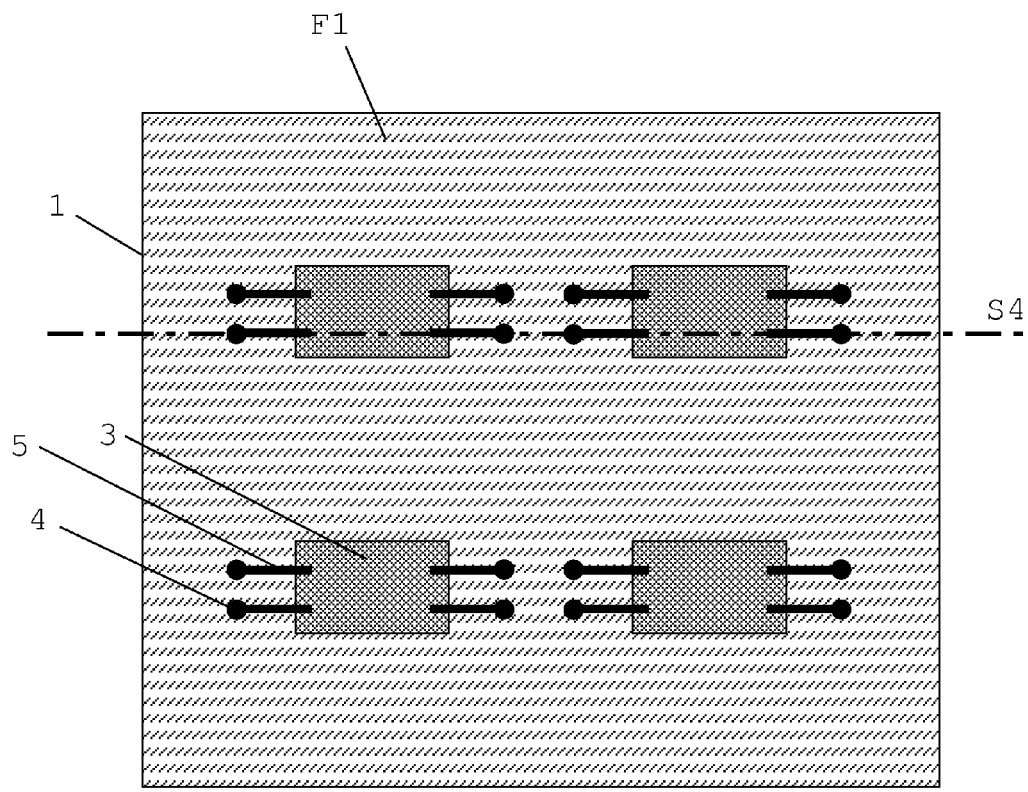
Fig. 4.a
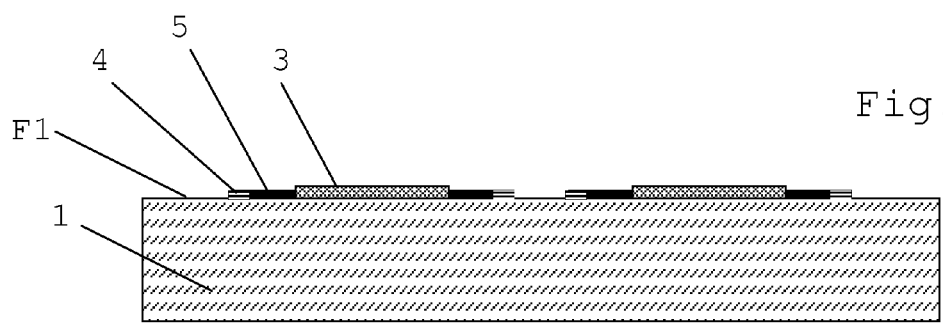
Fig. 4.b

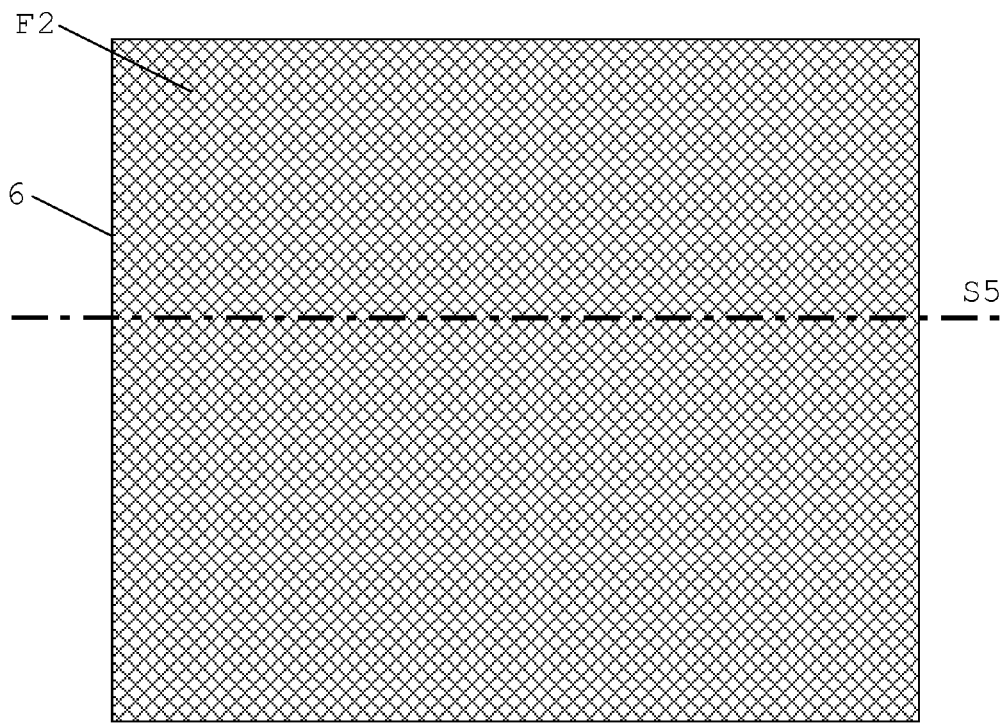
Fig. 5.a
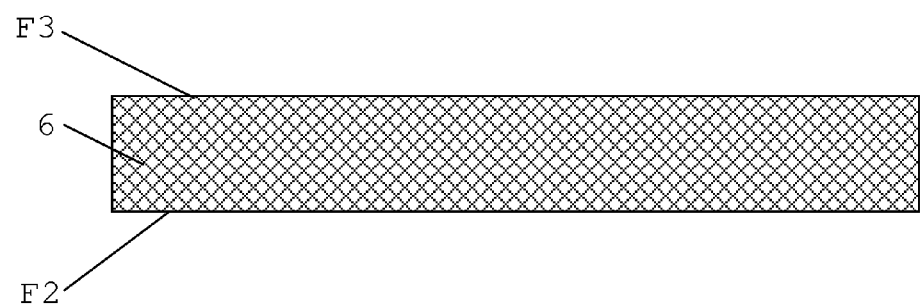
Fig. 5.b

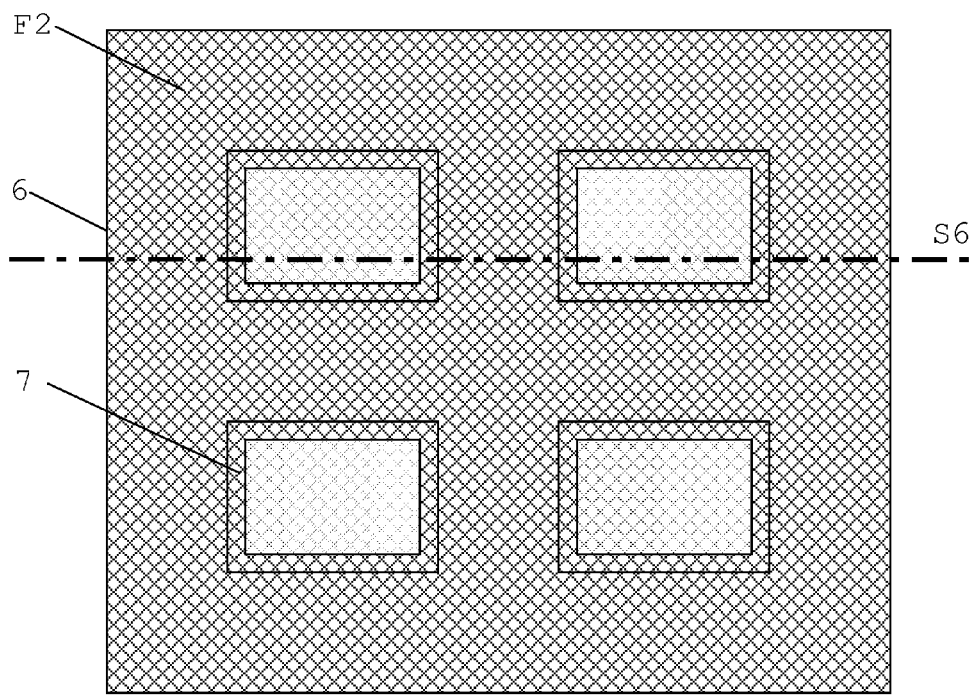
Fig. 6.a
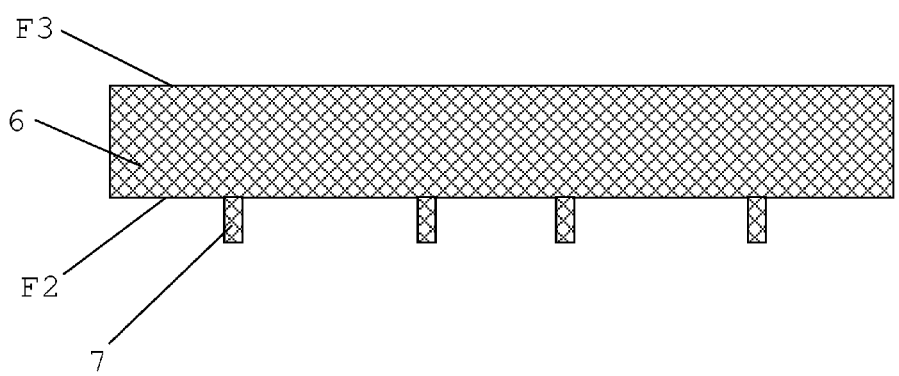
Fig. 6.b

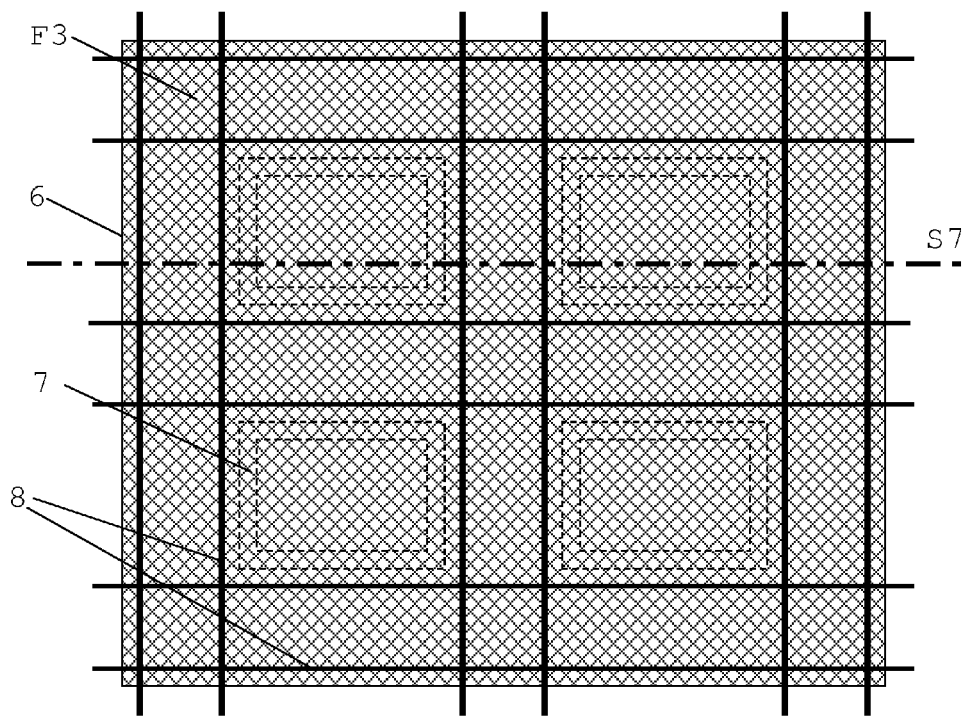
Fig. 7.a
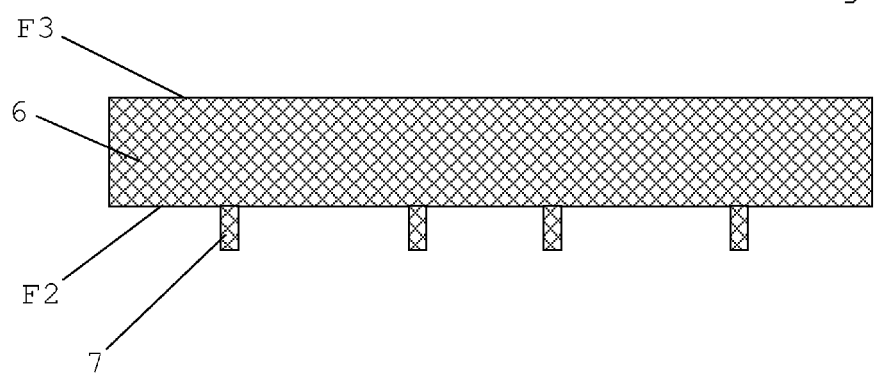
Fig. 7.b

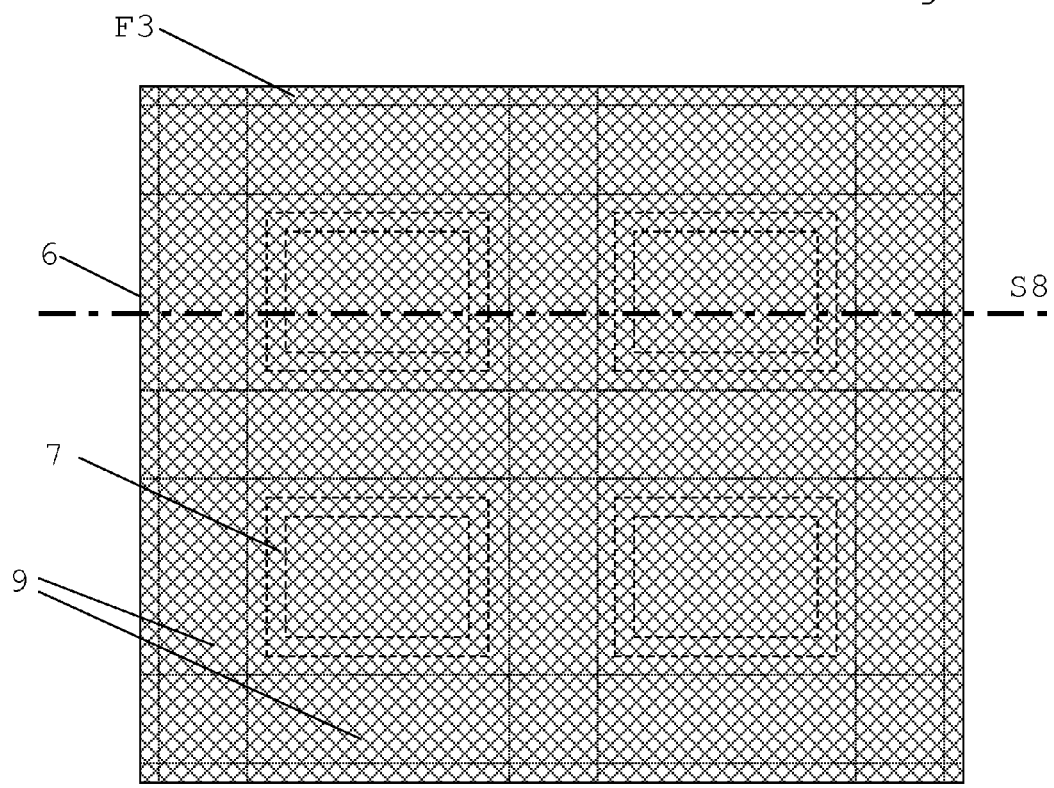
Fig. 8.a
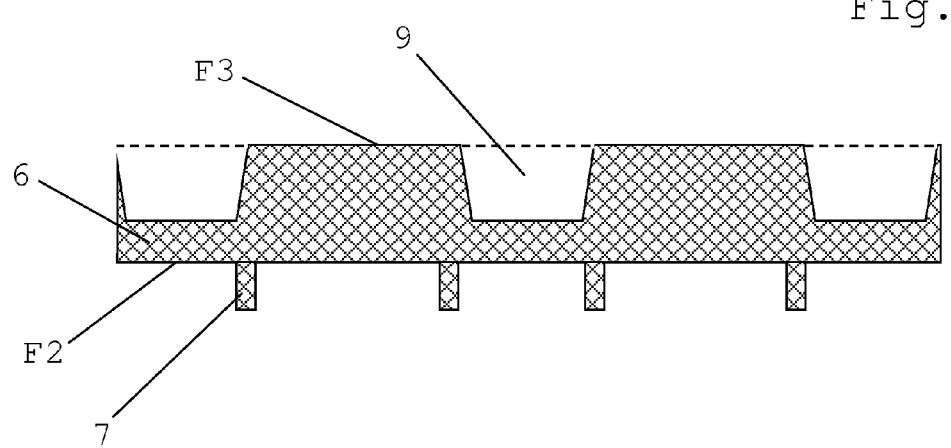
Fig. 8.b

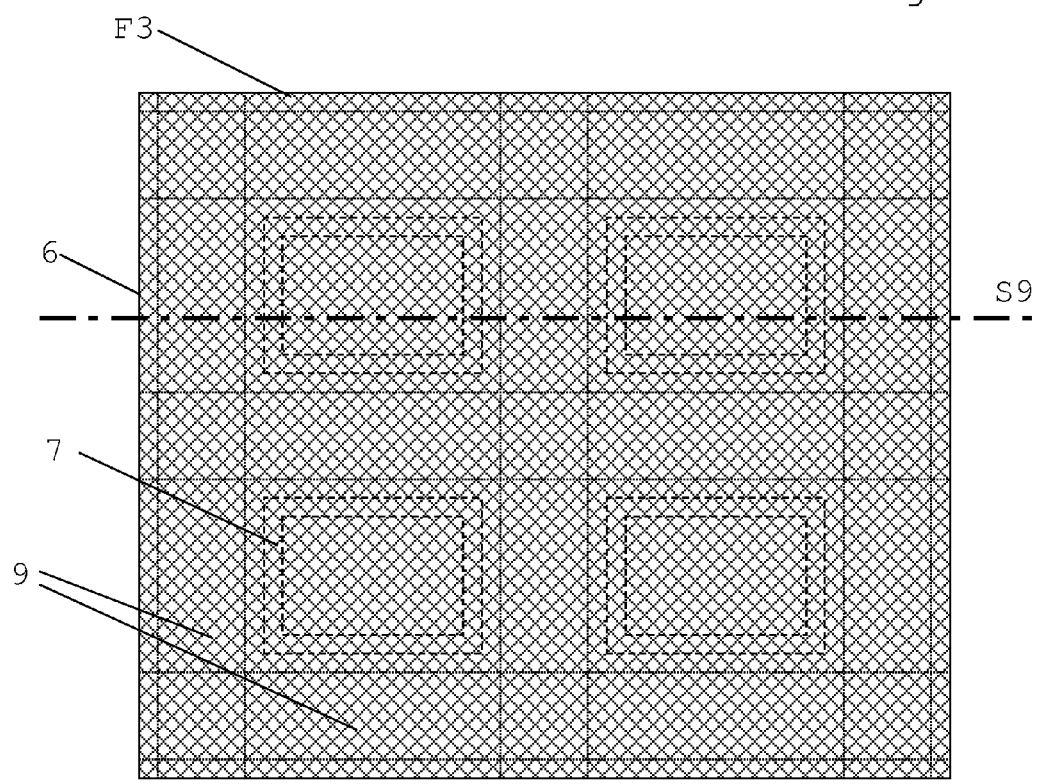
Fig. 9.a
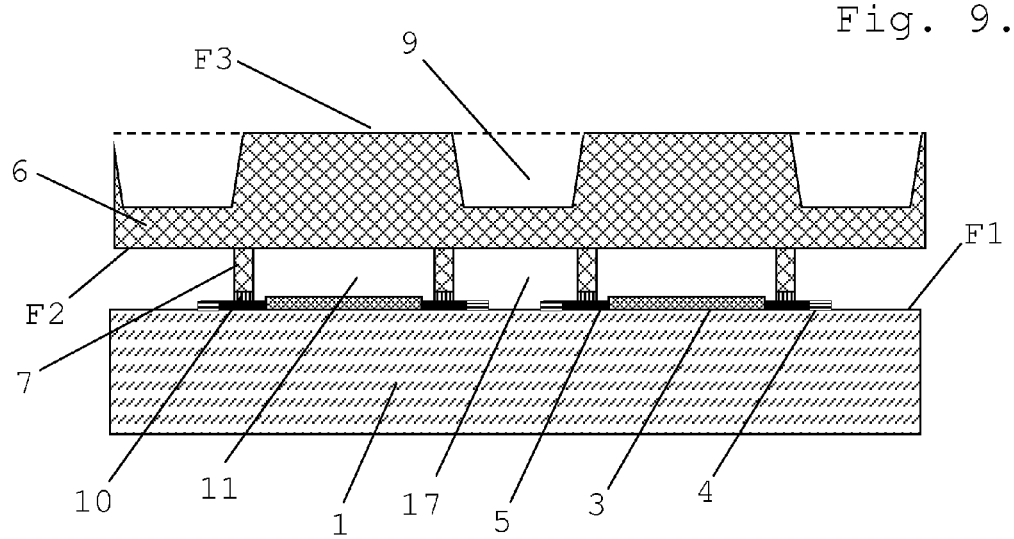
Fig. 9.b

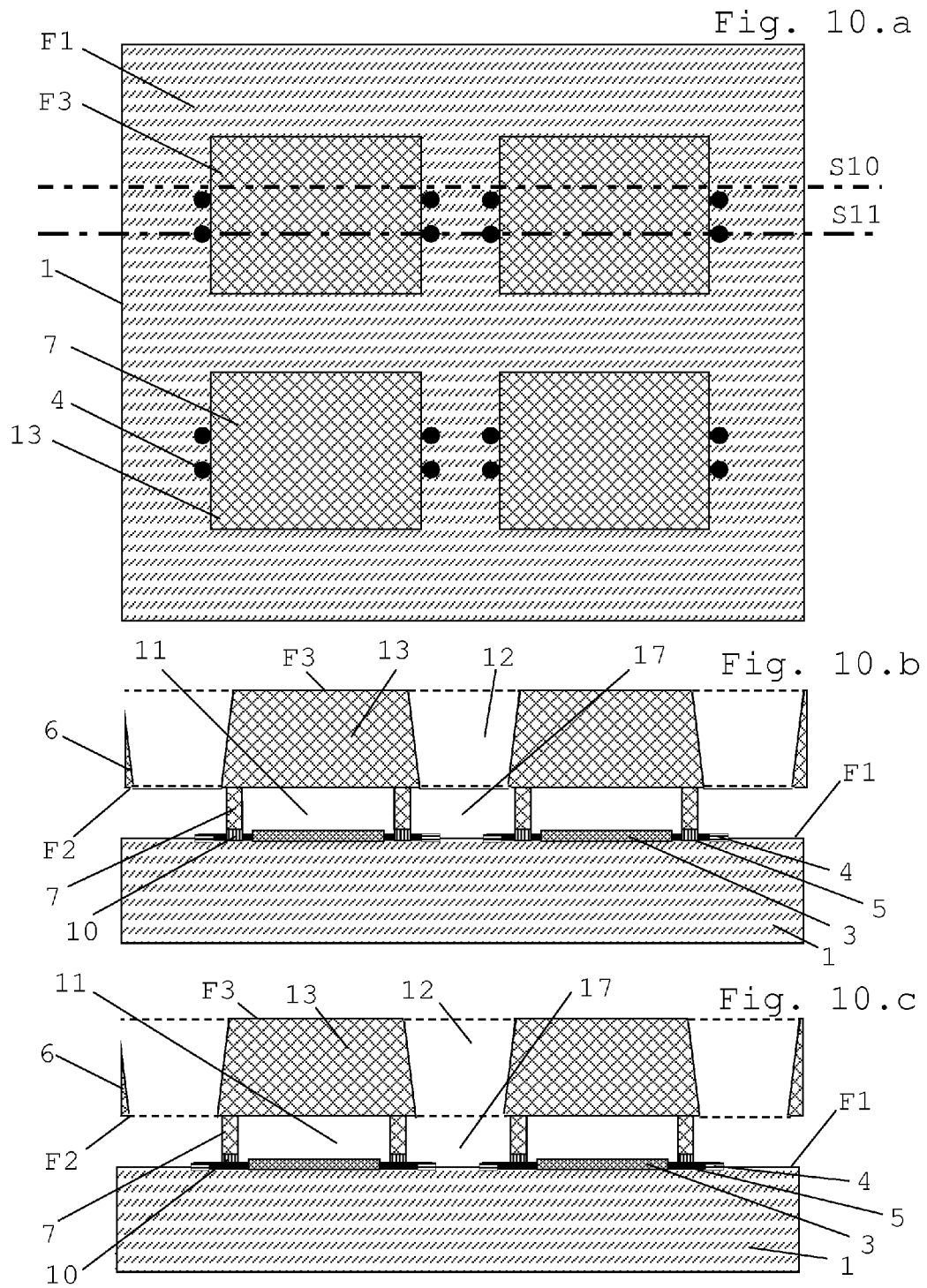

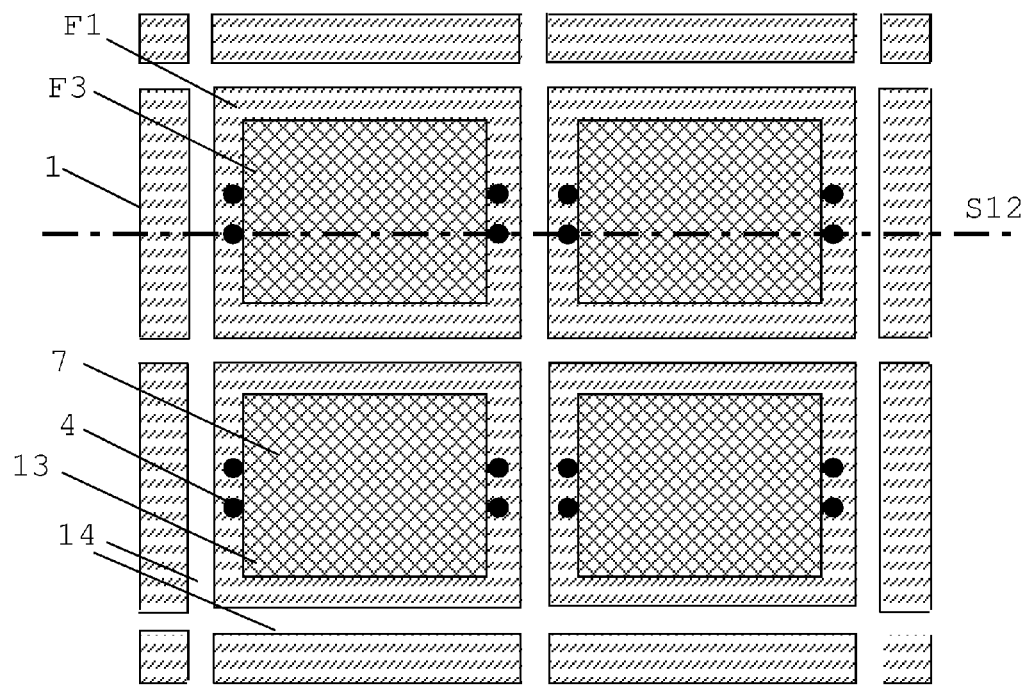
Fig. 11.a
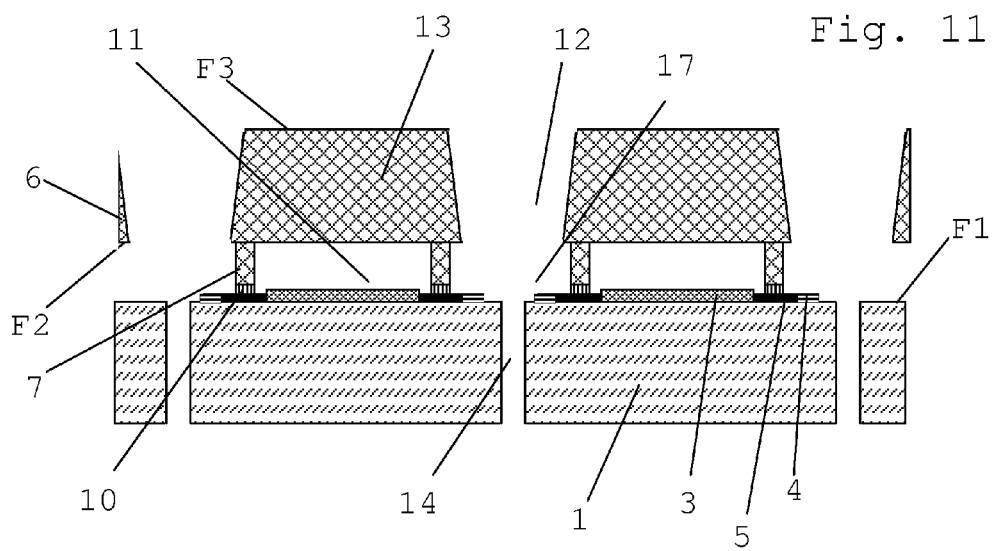
Fig. 11.b

METHOD FOR PRODUCTION OF PACKAGED ELECTRONIC COMPONENTS, AND A PACKAGED ELECTRONIC COMPONENT

DESCRIPTION OF THE INVENTION

The invention relates to a method for production of packaged, electronic, in particular optoelectronic, components in a composite wafer, and to packaged, electronic, in particular optoelectronic, components.

BACKGROUND TO THE INVENTION

Technologies which allow the production of accurately structured encapsulation or passivation layers and/or cavities have been developed for the manufacture of integrated electronic, optoelectronic or other components for microsystems. Optoelectronic components which have an optical sensor or optically active elements are packaged using translucent covers which protect the light-sensitive elements against environmental influences, such as moisture, or, for example, against mechanical damage.

In this case, glass is used for a multiplicity of applications, inter alia, because of its optical characteristics and excellent passivation characteristics. In comparison to the plastics which are frequently used for packaging and encapsulation of semiconductor components, glasses have, for example, significantly less permeability for air and, furthermore, also offer excellent protection against water, water vapor and in particular also against corrosive substances, such as acids and bases.

Microcomponents packaged in this way are typically used in conjunction with, for example, fingerprint sensors, MEMS parts, CCT cameras and scanners. This means that these methods are particularly suitable for packaging of components which have a sensitive area, for example an optical sensor, which must be protected by a package in which, however, the package must ensure that the sensor retains its external, for example optical, accessibility.

The manufacture of the component, the packaging of the components and the production of the connecting contacts to the exterior are carried out either while still in a composite form in a wafer (wafer-level packaging) or on the separated component or semiconductor chip (single-size packaging).

However, packaging of the components or chips after separation has the disadvantage that the integrated circuits and/or sensitive areas of the component are exposed during the separation process, and their function is adversely affected by the dirt or dust created when sawing up (dicing) the wafers.

During the course of wafer-level packaging, the active area, for example in the case of an optically active area of a semiconductor component, is therefore protected by adhesively bonding a glass or a film on the silicon wafer.

The completely cut components, so-called dice, must, however, be readjusted and aligned after the dicing process, that is to say after the dice have been separated from the wafer, before they can be subjected to the packaging process, and this leads to additional manufacturing steps, correspondingly slowing down production, and making it more expensive.

In the meantime, widely differing wafer-level packaging methods, in particular, have been used for the production of integrated electronic and optoelectronic or other microcomponents.

One fundamental problem which frequently occurs in this case is that the materials which are used for covering can be structured only with difficulty in order, for example, to provide contact connections passing through for connecting contacts.

Conventional techniques such as ultrasound oscillation lapping are normally used to produce holes in the packaging or covering material although only relatively "large" holes with a diameter of about 0.5 mm can be produced in this case.

Document WO 99/40624 has already proposed for a plurality of electrical contacts to in each case share one hole, thus making it possible to reduce the number of holes and, in consequence, to increase the structure density. In this case as well, however, very small holes, which are therefore difficult to produce, are still required, with the additional complication of having to pass a plurality of contact connections through one hole.

The production of "pocket-like" structures, as described in patent application DE 10147648 A1 for production of cavities ("hollows") and holes in a glass wafer is carried out by heating a glass pane to its softening temperature, after which it is shaped on a negative mold, and is finally cooled down. The structures produced, in the range from 2 to 5 mm, do not yet lead to sufficiently small structures, however. Furthermore, the surface quality of the deformed glass pane is inadequate, in terms of its optical quality for high-sensitivity optical parts.

In addition, glasses which can be structured photographically, such as "Foturan" are available, and allow fine structures to be produced by photolithography. However, they have the disadvantage that these glasses have a coefficient of expansion which is not the same as that of silicon, which is normally used as the mount substrate, and packaging or covering with these glasses leads to stresses between the substrate and the package.

After the final step of packaging and/or contact exposure, the wafer is broken up into individual, generally square chips (so-called dicing). The dicing process is typically carried out using a saw, cut-by-cut, with a feed rate of approximately 2 to 3 mm/min. The time required to completely dice a wafer can therefore be in the order of magnitude of an entire day, resulting in correspondingly high costs. The mechanical characteristics of the passivation layers and packages can additionally exacerbate and slow down the dicing of the wafer, depending on the material, especially in the case of glass-like materials.

GENERAL DESCRIPTION OF THE INVENTION

The object of the invention is therefore to provide packaged electronic, in particular optoelectronic, microcomponents which can be bonded easily and flexibly, and a simplified and economic method for producing them.

The method according to the invention for production of packaged electronic components with an integrated functional element comprises the following steps:

a) a mount substrate and a cover substrate are provided,
b) the functional elements are fitted to the mount substrate within predetermined grid areas,
c) bonding elements are fitted to the mount substrate within predetermined grid strips which run between the grid areas, and the connecting contacts are produced between the functional elements and the bonding elements,
d) a microframe structure composed of glass is fitted to the lower face of the cover substrate and/or to the upper face of the mount substrate, with cavities being produced corresponding to the grid areas, and with channels being produced corresponding to the grid strips,
e) a macrostructure is introduced at least on the upper face of the cover substrate or at least on the lower face of the cover substrate by removal of surface areas, with trenches being produced corresponding to the grid strips on the mount substrate, f) the mount substrate and cover substrate are joined together to form a composite substrate, with the functional elements being packaged, and g) the composite substrate is split along a predetermined track within the grid strips, with the composite substrate being broken up into individual components, and with the bonding elements of the separated components being exposed at the same time.

For the purposes of this invention, electronic components are defined as functional elements with electrical connections. Functional elements are active semiconductor components and/or sensors and elements for micro-electromechanics and micro-optoelectronics.

The method steps up to f) need not necessarily be carried out successively and, if this is worthwhile, they can also be carried out in parallel or in a different sequence. Only method step g) must be carried out as the final method step.

The grid areas and strips can be predetermined by markings, masks etc. although this can also be done by means of an appropriately predetermined, for example controllable, positioning process for the functional elements, corresponding to an imaginary grid on the mount substrate.

The bonding elements which are used as contact areas for external connections of the components can preferably be fitted, and the internal contacts between the functional element and bonding elements can be made, by fitting suitable conductive structures to the mount substrate. These structures can be produced, for example by means of appropriate masks and coating methods such as vapor-deposition or sputtering, using a lift-off technique. A further possible way to make contact is to fit mount films with prefabricated arrangements of flexible metallic film conductors (tape automated bonding), flip-chip technology, beam-lead technology, photolithographic structuring or other methods that are known per se.

Semiconductor wafers, in particular composed of silicon, are preferably used as mount substrates for electronic components.

The cover substrate which is intended to be used to encapsulate a wafer composite may comprise a flat semiconductor, plastic, ceramic or metal wafer, preferably with a thickness of 500 to 1000 µm.

Particularly for optical functional elements and/or for functional elements for which hermetically sealed encapsulation is important, the cover substrate preferably comprises a flat glass pane with a thickness of 500 to 1000 µm. Substrates composed of borosilicate glass, for example Borofloat 33, are particularly suitable for cover substrates because this type of glass has a coefficient of expansion which is approximately the same as that of silicon.

The microframe structure can be fitted both to the finished mount substrate and to the cover substrate.

The microframe structure is produced by vapor-deposition of a glass layer, which is preferably vapor-deposited and structured by means of a mask. Photolithographic methods, in particular the lift-off technique, which are known in principle to those skilled in the art, are suitable for structuring. A borosilicate glass, for example the vapor-deposition glass 8329 or G018-189 from the SCHOTT Glas Company, is used, in particular, as the vapor-deposition glass. One advantage of this method is that an insulating microframe structure composed of glass is applied at temperatures up to 150° C., thus avoiding high temperatures. Appropriate methods for production of a microstructure composed of glass are described in the application DE 102 22 609 A1 from the same applicant, whose disclosure content is incorporated by reference.

The microframe structure is designed such that, when the two substrates are joined together, each functional element is surrounded by a frame and is located within the cavities that are formed, and the bonding elements are arranged in areas of channels which are formed between adjacent frames. The structuring process is carried out on the basis of the arrangement of the functional elements and their bonding elements, in accordance with the prior definition of the grid areas and strips as described above.

In order to produce structures which are as small as possible on the wafer, the frame webs of the microframe structure have a width of 1 to 500 µm, preferably of 80 to 100 µm. The frame size is governed by the dimensions of the functional elements.

The height of the frame webs of the microframe structure is governed mainly by the requirements of the integrated functional elements, and they preferably have a height such that the cover substrate does not touch the functional elements. The orders of magnitude for the web heights are normally in the range from 1 to 1000 µm, preferably from 3 to 10 µm.

The production of the macrostructure on the cover substrate serves to reduce the substrate thickness on a predetermined track within the grid strips along which the finished composite substrate is intended to be broken up into individual components. Reducing the glass thickness by 10 to 80% in the sawing area allows considerably faster chip separation later.

Trenches which run corresponding to the channels of the microstructure and have a width or a mean width which corresponds at most to the width of the channels, preferably with a width from 200 to 500 µm, are preferably introduced for this purpose by removal of material from the cover surface. The trenches in the macrostructure can be introduced into the upper face and/or lower face of the cover substrate.

The macrostructure is produced by removal of surface areas of the cover substrate, preferably by means of etching, sandblasting or ultrasound oscillation lapping.

If the microframe structure is fitted to the lower face of the cover substrate, the macrostructuring is preferably subsequently carried out on the cover substrate.

The mount substrate and cover substrate must be joined together in an appropriately adjusted form for encapsulation or packaging of the functional elements in the wafer composite. During this process, cavities are formed around the functional elements. The bonding elements are located outside these cavities, that is to say the frame structures are continued over the contacts (interconnects) in order to ensure electrical connection of the packaged functional element through the encapsulation to the exterior.

If the microframe structure is fitted to the upper face of the mount substrate, the frames are vapor deposited around the functional elements and over the contacts in hermetic form, thus ensuring a contact which is passed hermetically through the frame to the exterior.

The microframe structure on the upper face of the mount substrate is then joined to the lower face of the cover substrate, preferably by means of anodic bonding, fusion bonding, sol-gel bonding, low-temperature bonding, soldering or adhesive bonding, adjusted as appropriate with respect to the composite substrate. Forming the cover substrate from glass, that is to say with a transparent material, considerably simplifies the adjustment process.

If the microframe structure is fitted to the lower face of the cover substrate, the frame cannot be bonded directly to the mount substrate, since the contacts on the mount substrate must be bridged hermetically. The connection to form a composite substrate is made by means of a connection layer, which is preferably applied to the microframe structure. In one preferred embodiment, the connection layer is an adhesive layer, preferably composed of epoxy resin, by means of which the two substrates are adhesively bonded.

The chips which are packaged in the wafer composite are preferably separated by exposure of the channels along the trenches of the cover substrate, with the bonding elements being exposed at the same time, and by separation of the mount substrate along a predetermined track, which preferably runs centrally along the channels.

The channels can be exposed by means of a saw, which preferably has a relatively wide saw width (approximately 100 to 500 μm) or by means of sandblasting or ultrasound oscillation lapping along the trenches of the macrostructure on the cover substrate. The mount substrate is preferably separated by means of a saw which has a relatively narrow saw width (approximately 100 μm).

The very thin material of the cover substrate in the area of the trenches allows the highly costly sawing process to be carried out in a considerably shorter time.

The method according to the invention allows simple and effective production of packaged components. These have easily accessible bonding elements located on the outside, which are highly suitable for conventional technologies and bonding methods, for example wire-bonding methods.

The object is also achieved by an electronic component according to the invention which can be produced using the method described above and comprises a composite composed of a mount substrate and a cover substrate, or comprises a composite composed of a mount substrate and a cover substrate, with at least one functional element and at least one bonding element, which makes contact with the functional element, being arranged on the mount substrate, with the cover substrate being a microstructured glass which is arranged on the mount substrate and forms a cavity over the functional element, and with the bonding elements being located outside the cavity on the mount substrate.

The mount substrate is preferably composed of silicon. This results in the cover substrate and mount substrate having approximately the same coefficient of expansion, as a result of which no stresses occur between the substrates.

The cover substrate forms the package for the functional element and, because of its physical characteristics, is particularly suitable for packaging active-sensor and optically-active functional elements.

Furthermore, a dense composite can be achieved between the mount substrate and cover substrate by suitable connection technologies, for example as described in the method according to the invention.

In order to form a cavity in the cover substrate, which cavity is intended to house the functional element located on the mount substrate, the cover substrate is preferably composed of a flat glass pane with a vapor-deposited microglass frame. Possible methods for production of such microframes are likewise described in the method according to the invention.

Electronic components should be manufactured with small dimensions for many applications. In one advantageous embodiment, the glass pane has a thickness of 500 to 1000 μm, the frame webs of the microglass frame have a width of 1 to 500 μm, preferably of 80 to 100 μm, and a height of 1 to 1000 μm, preferably of 3 to 10 μm.

By the introduction of the macrostructure according to the invention into the cover substrate and the separation of the composite substrate, the electronic component is characterized in that at least one side surface of the cover substrate has at least one first section and one second section, with the at least first section and the second section having a different surface condition.

The different surface condition results from the use of different methods for introduction of the macrostructure and for breaking up the composite substrate into individual electronic components. In particular, grooves or scores can be formed along the saw track in the side surfaces of the cover substrate during the separation or dicing of the composite substrate into individual electronic components. However, grooves or scores such as these may be particularly disadvantageous for packaged optically active functional elements.

As already mentioned, the macrostructure is produced by removal of surface areas of the cover substrate, and in the process preferably by means of etching, sandblasting and/or ultrasound oscillation lapping, thus making it possible to achieve a better surface quality in the sawing area of the side surface of the cover substrate, at least in comparison to the present sawing process. Furthermore, the possibility of crack formation in the cover substrate can be reduced, which cracks can be formed in particular starting from edges.

The at least first section and the second section preferably have different roughness. Alternatively or in addition to this, the at least first section and the second section may have a different evenness and/or structure.

The freely accessible bonding elements which are located outside the package have bonding pads which can be wire-bonded or soldered, in a further advantageous refinement of the invention. Au, Al, TiCu, AlSiCu or AlSiTi are preferably used as possible materials for the bonding pads.

Conventional bonding methods are, for example, wire bonding with a thermal compression method, thermal-compression bonding with gold bumps, ultrasound wire bonding, thermosonic wire bonding or soldering with solder bumps. Use of glass for packaging actually makes it possible to use these bonding methods for sensitive functional elements, in particular even temperature-sensitive functional elements. The contact with and the joining of the components according to the invention to form assembles (packaging) and microsystems are in this case possible by means of industrially widespread and modern manufacturing technologies, such as tape automated bonding or flip-chip bonding.

In a further advantageous embodiment, the electronic component has a heat-dissipating base substrate which is arranged on the lower face of the mount substrate (1), preferably composed of silicon. The mount substrate and the base substrate are attached to one another by means of an adhesive or soldered joint. The heat-dissipating substrate can at the same time form the base substrate for further components and/or assemblies.

In a further advantageous embodiment of the electronic component, solder bumps are applied to the bonding elements and connect the mount substrate to bonding elements on the lower face of a base substrate which is provided with an opening for the packaged functional element. The solder bumps are small electrically conductive material deposits by means of which both the electrical and the mechanical and/or thermal connection is produced between the mount substrate and the base substrate. If the solder bumps are melted on between the bonding pads of the substrates, for example by means of reflow technology, this results in the substrates being connected in a self-adjusting manner, without any stresses. The base substrate is, for example, part of an optical assembly, within which the packaged functional element, in particular with an optical function, can be arranged.

According to the invention, an optical assembly has a base substrate with an opening and bonding pads on the lower face, an optical part, for example a lens, which is arranged above the opening and is connected to the base substrate, and a packaged electronic component, which comprises at least one optically sensitive functional element. The base substrate has bonding pads, which are arranged in a defined manner and can be soldered, on its lower face, so that the electronic component can be mounted underneath the opening. The connection between the base substrate and the electronic component is a finely-centered connection which is produced by melted-on solder bumps which are located between the bonding pads on the base substrate and the bonding pads on the electronic component. This allows an accurately centered and extremely dense arrangement of the optical part, for example of a lens, with respect to the electronic component.

Optical assemblies such as these are used in particular in digital cameras.

Furthermore, a composite substrate which is preferably produced or can be produced with a section of the method as described above but has not yet been separated into individual electronic components, is within the scope of the invention. The use of a composite substrate such as this is particularly worthwhile when the composite substrate is produced at a first location, for example in a clean room, and the dicing process is carried out at a different location, for example in a so-called gray room, and the composite substrate must first of all be transported there.

According to the invention, the composite substrate has a mount substrate and a cover substrate which is connected to the mount substrate. Functional elements are fitted to the mount substrate within predetermined grid areas, and bonding elements are also fitted within predetermined grid strips, which run in particular between the grid areas. The bonding elements form the connecting contacts to the functional elements mentioned above. At least one microframe structure, preferably composed of glass, is arranged on the lower face of the cover substrate and/or on the upper face of the mount substrate, with cavities being produced corresponding to the grid areas and channels being produced corresponding to the grid strips, and with at least one functional element being arranged within a cavity. Furthermore, at least one macrostructure is introduced on the upper face of the cover substrate and/or on the lower face of the cover substrate by removal of surface areas, with trenches being produced corresponding to the grid strips of the mount substrate.

The features mentioned for the method according to the invention and for the electronic component according to the invention are likewise applicable to the composite substrate described above.

Figure 13:
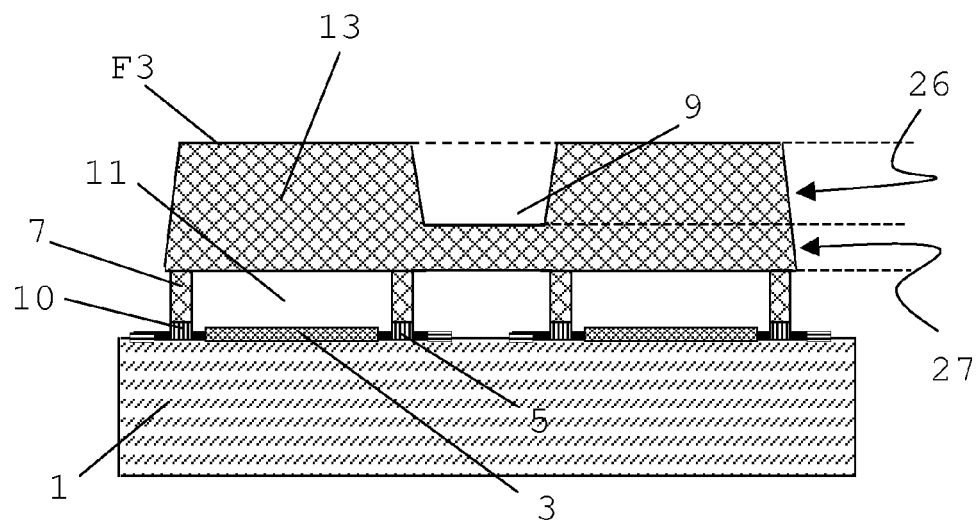
Figure 14:
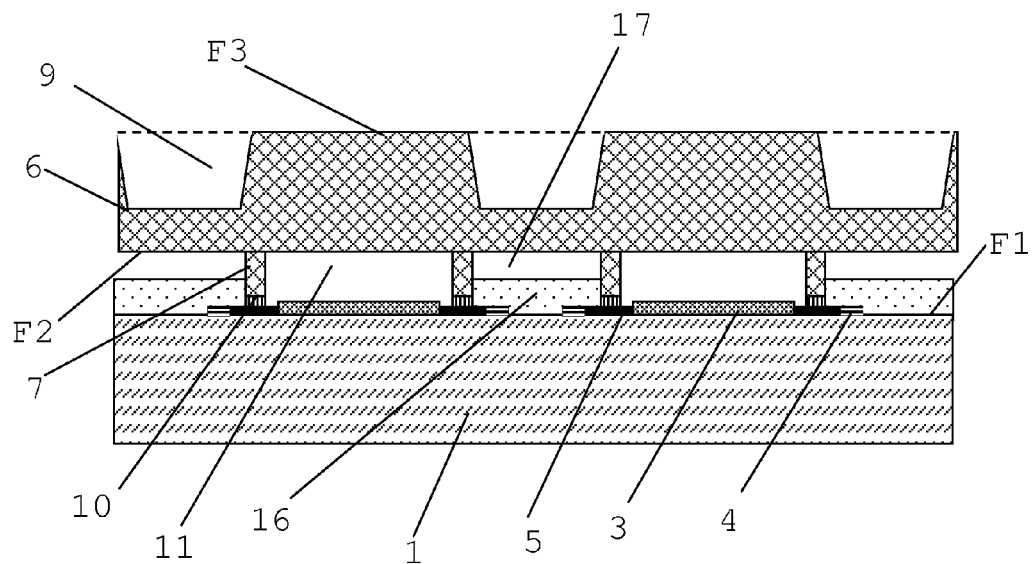
Figure 15:
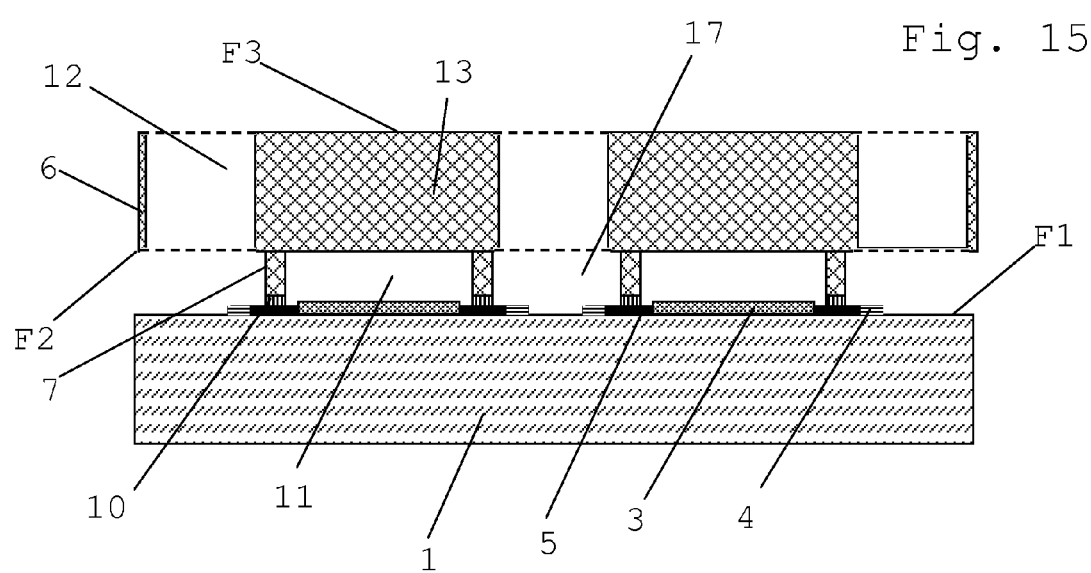
Figure 16:
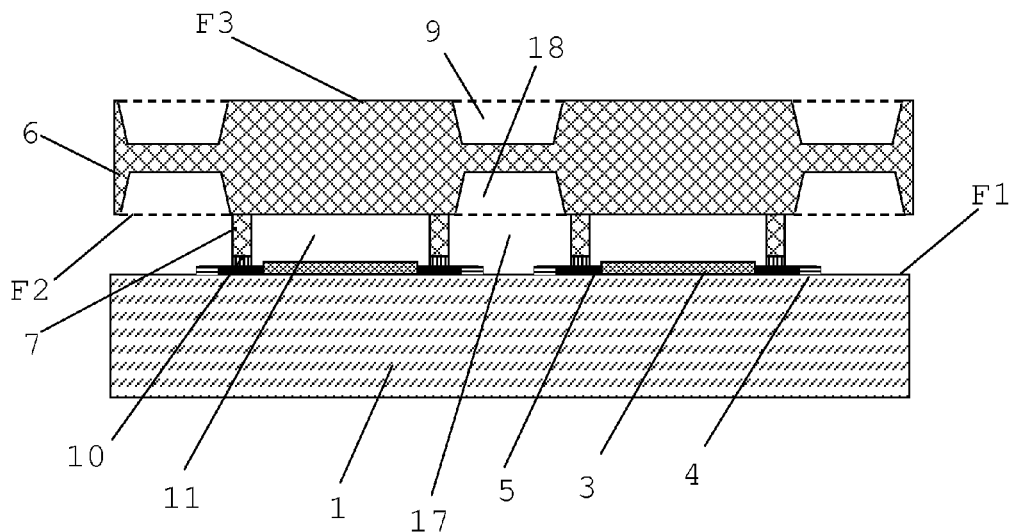
Figure 17:
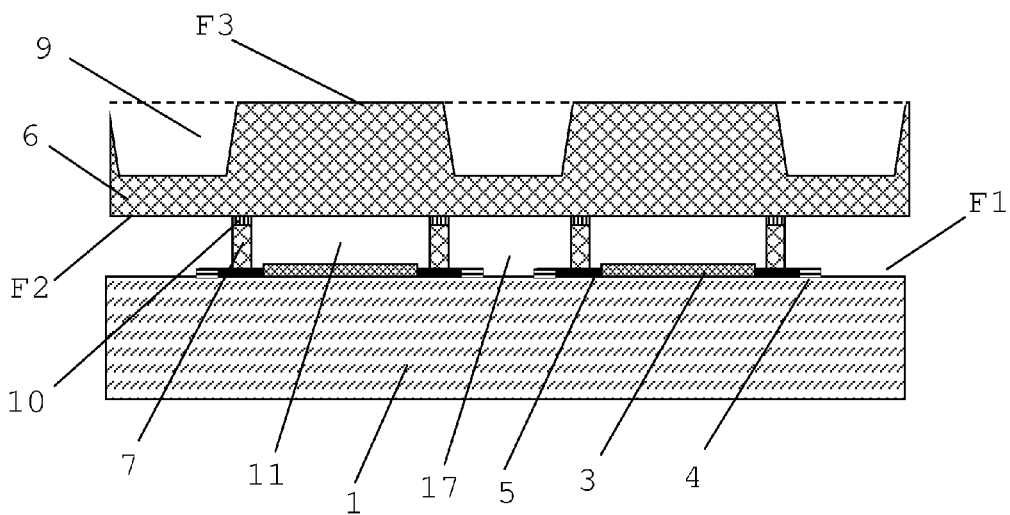
Figure 18:
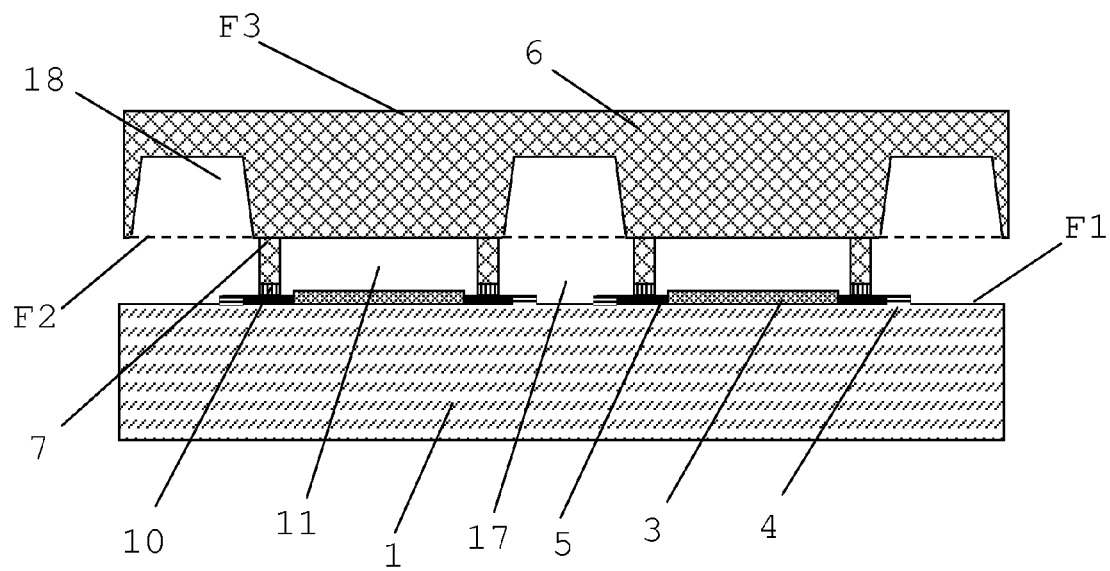
Figure 19:
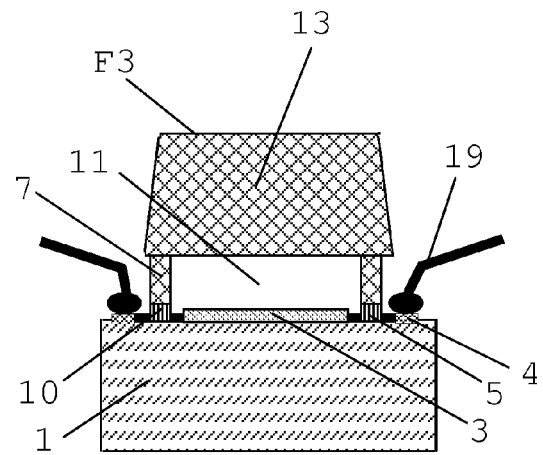
Figure 20:
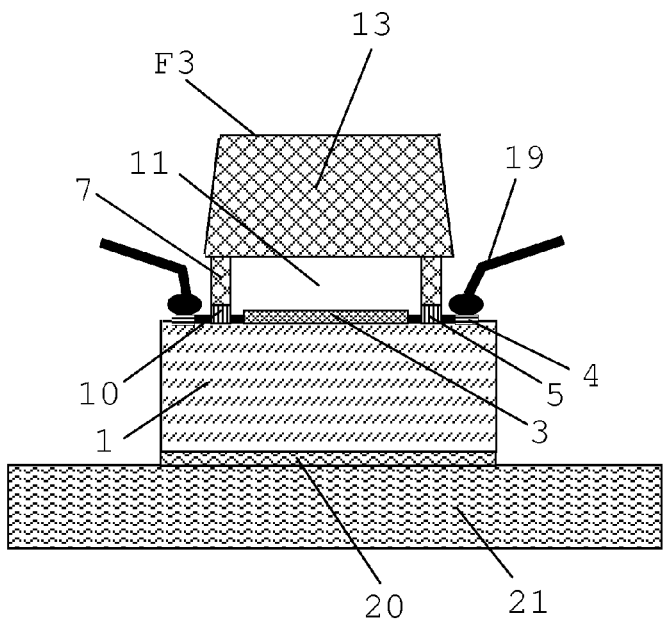
Figure 21:
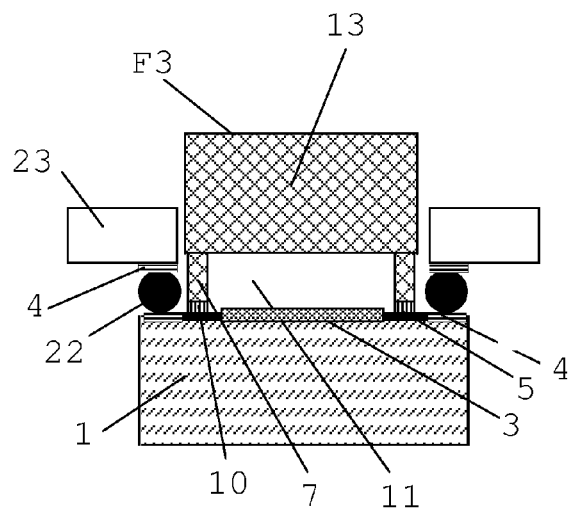
Figure 22:
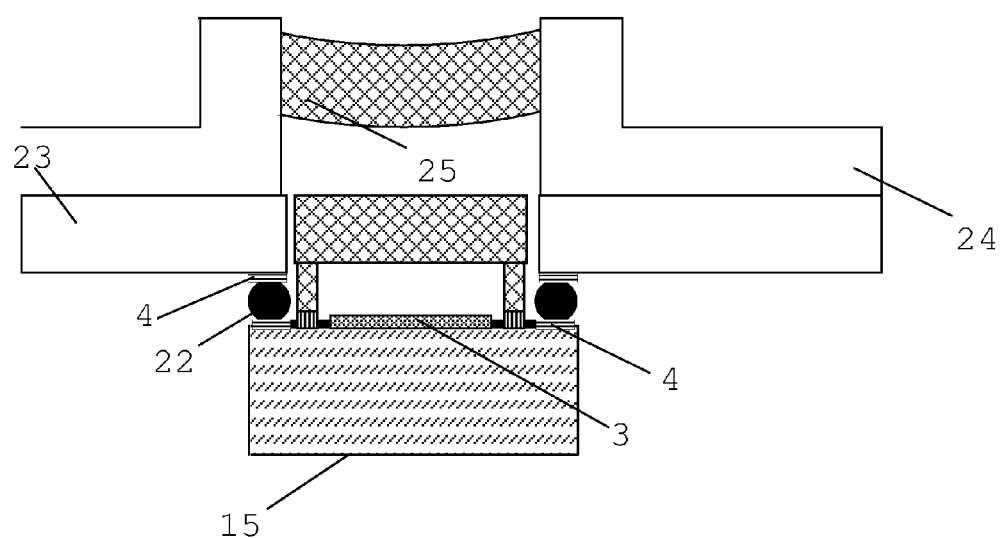

The invention will be explained in more detail in the following text with reference to exemplary embodiments. In the figures:

FIG. 1.*a* shows a plan view of a mount substrate,

FIG. 1.*b* shows an enlarged detail of the mount substrate,

FIG. 1.*c* shows a section illustration of the mount substrate from FIG. 1.*b*, along the section line S1, FIG. 2.*a* shows a plan view of a mount substrate with functional elements, FIG. 2.*b* shows a section illustration of the mount substrate from FIG. 2.*a*, along the section line S2, FIG. 3.*a* shows a plan view of a mount substrate with functional elements and bonding elements, FIG. 3.*b* shows a section illustration of the mount substrate from FIG. 3.*a*, along the section line S3, FIG. 4.*a* shows a plan view of a mount substrate with connecting contacts between functional elements and bonding pads, FIG. 4.*b* shows a section illustration of the mount substrate from FIG. 4.*a*, along the section line S4, FIG. 5.*a* shows a plan view of the lower face of a cover substrate, FIG. 5.*b* shows a section illustration of the cover substrate from FIG. 5.*a*, along the section line S5, FIG. 6.*a* shows a plan view of the lower face of a cover substrate with a microframe structure, FIG. 6.*b* shows a section illustration of the cover substrate from FIG. 6.*a*, along the section line S6, FIG. 7.*a* shows a plan view of the upper face of the cover substrate with grid strips for the macrostructure, FIG. 7.*b* shows a section illustration of the cover substrate from FIG. 7.*a*, along the section line S7, FIG. 8.*a* shows a plan view of the upper face of the cover substrate with trenches for the macrostructure, FIG. 8.*b* shows a section illustration of the cover substrate from FIG. 8.*a*, along the section line S8, FIG. 9.*a* shows a plan view of the upper face of the composite substrate, FIG. 9.*b* shows a section illustration of the composite substrate from FIG. 9.*a*, along the section line S9, FIG. 10.*a* shows a plan view of the upper face of the composite substrate with the bonding elements exposed, FIG. 10.*b* shows a section illustration of the composite substrate from FIG. 10.*a*, along the section line S10, FIG. 10.*c* shows a section illustration of the composite substrate from FIG. 10.*a*, along the section line S11, FIG. 11.*a* shows a plan view of the diced composite substrate, FIG. 11.*b* shows a section illustration of the composite substrate from FIG. 11.*a*, along the section line S12, FIG. 12 shows a packaged electronic component, FIG. 13 shows a partially diced composite substrate, FIG. 14 shows a section illustration of a composite substrate with protected bonding elements, FIG. 15 shows a section illustration of the composite substrate from FIG. 14, after the bonding elements have been exposed, FIG. 16 shows a section illustration of a composite substrate with a macrostructure on both sides of the cover substrate, FIG. 17 shows a section illustration of a composite substrate with a microframe structure on the mount substrate, FIG. 18 shows a section illustration of a composite substrate with a macrostructure on the lower face of the cover substrate, FIG. 19 shows a section illustration of a wire-bonded electronic component, FIG. 20 shows a section illustration of a wire-bonded electronic component on a base substrate, FIG. 21 shows a section illustration of a solder-packaging component, and FIG. 22 shows a section illustration of an optical assembly.

PRODUCTION OF THE MOUNT SUBSTRATE

FIG. 1.*a* shows a wafer in an embodiment in which the mount substrate (1) is composed of silicon. A grid in the form of grid areas (2) is located on the surface F1 of the mount substrate (1).

The grid areas (2) in this case need not actually be present on the surface F1. In fact, they symbolize the arrangement of the functional elements (3), which are fitted on the surface F1 of the mount substrate (1) in the further method steps which will be described in the following text. It should also be noted that the grid areas (2) can be arranged in a different arrangement and form on the surface F1 of the mount substrate (1). However, in this specific embodiment, the aligned arrangement of the bonding elements (4) between the functional elements (3) and the dicing of the wafer, for example by sawing, can be carried out particularly easily, since the sawing process can be carried out on straight paths.

FIG. 1.b shows the detail Z, as marked in FIG. 1.a, in the form of an enlarged illustration with the predetermined grid system. FIG. 1.c is a schematic illustration from FIG. 1.b, along the section line S1.

With reference to FIG. 2.a, the functional elements (3) are fitted on the surface F1 of the mount substrate (1) by methods which are known per se to those skilled in the art, for example by means of bonding or adhesive-bonding joints, within or on the predetermined grid areas (2). Possible embodiments of the functional elements (3) are, for example, micro-optoelectronic, micro-optical-electromechanical, electronic systems (MOEMS), for example (organic) light-emitting and light-absorbent sensors ((O)LED). Further embodiments of the functional elements (3) are included, even if these are not mentioned explicitly. FIG. 2.b is the illustration associated with FIG. 2.a, along the section line S2.

With reference to FIG. 3.a, bonding elements (4), so-called bonding pads, are fitted within the predetermined grid strips (8) on the surface F1 of the mount substrate (1). FIG. 3.b is the illustration associated with FIG. 3.a, along the section line S3. The position of the bonding elements (4) is preferably chosen such that they are located in a regular arrangement, close to the functional element (3), with a straight track for the subsequent dicing of the components remaining between the bonding elements (4) of different functional elements (3).

As shown in FIG. 4.a, the connecting contacts (5) between the functional elements (3) and the bonding elements (4) are interconnects which are vapor-deposited on the surface F1 of the mount substrate (1) and are composed of aluminum. Alternatively, the connecting contacts (5) may also be composed of gold, tungsten or titanium-tungsten. FIG. 4.b is the illustration associated with FIG. 4.a, along the section line S4.

The separately described method steps, fitting of the bonding elements (4) and fitting of the connecting contacts (5), can also be carried out in one method step. This means that, in a further embodiment which will not be described in detail here, the connecting contact (5) can therefore also directly comprise the bonding element (4).

It is obvious to a person skilled in the art that the method steps described in FIGS. 2, 3 and 4 can also be carried out in a different sequence.

Production of the Cover Substrate:

FIG. 5.a shows a detail (analogously to the detail Z of the mount substrate (1) in FIGS. 1-4) of the cover substrate (6) with its lower face F2. The cover substrate (6) is composed of glass, and its thermomechanical characteristics are in this case matched to the mount substrate (2). FIG. 5.b shows the illustration associated with FIG. 5.a, along the section line S5, and, in addition to the lower face F2 of the cover substrate, also shows its upper face F3.

FIG. 6.a shows the same detail of the cover substrate (6) as in FIG. 5 after the fitting of the microframe structure (7) composed of glass on the lower face F2 of the cover substrate (6). FIG. 6.b is the illustration associated with FIG. 6.a, along the section line S6.

The figures do not explicitly illustrate the production of the microframe structure (7), but this is outlined in the following text.

A photoresist is applied to the lower face F2 to be structured, using a method that is known to those skilled in the art, and it is then photolithographically structured. A shadowmask, an adhering covering mask or a non-adhering covering mask can be used to produce the microframe structures (7). Analogously to the grid system, the lower face F2 then has a rectangular cutout for the frame to be formed, around each grid area (2). The subsequent package surface is covered by the mask. The glass is deposited directly on the cover substrate (6) within the cutouts in the mask. The glass layer is applied, for example, by means of plasma-ion-beam-assisted electron-beam vapor deposition. Those areas of the vapor-deposited glass layer which are located on the resist mask are then removed by means of a lift-off technique. The photoresist is dissolved in acetone for this purpose. The deposited glass is the areas of the cutouts in the photomask forms the desired microframe structure (7).

FIG. 6.a and FIG. 6.b show a detail of the cover substrate (6) after the fitting of the microframe structure (7).

With reference to FIG. 7, the vertical and horizontal grid strips (8), which are formed between the grid areas (2) on the mount substrate (1), are marked on the upper face F3 of the cover substrate (6). The surface areas are removed within these grid strips (8) in order to produce the macrostructure of the cover substrate (6). FIG. 7.b is the illustration associated with FIG. 7.a, along the section line S7.

Depressions or trenches (9) are produced on the upper face F3 of the cover substrate (6) using a subtractive process, for example an ultrasound oscillation lapping method, in the area of the grid strips (8). Since the subtractive method is used only in the area of the grid strips (8), that is to say outside the "area which can be seen" by the functional elements (3), the optical function/quality of the cover substrate (6) is retained. FIG. 8.a shows the cover substrate provided with the trenches (9) for this purpose, and FIG. 8.b shows a corresponding section illustration of the microstructured and macrostructured cover substrate (6), along the section line S8.

The sequence of the individual method steps may, of course, be changed. For example, the trenches (9) for the macrostructure can also be produced on the upper face F3 of the cover substrate (6) before vapor deposition of the microframe structure (7) on the lower face F2 of the cover substrate (6).

Production of the Composite Substrate:

The microstructured lower face F2 of the cover substrate (6) is positioned with respect to the upper face F1 of the mount substrate (1), and they are aligned with respect to one another in accordance with the grid system. With reference to FIG. 9, the microstructured and macrostructured cover substrate (6) and the mount substrate (1) with the functional element (3) and the bonding elements (4) with which contact has been made are joined together to form a composite substrate, and are connected to one another on the lower face of the microframe structure (7) via a bonding surface (10). By way of example, an epoxy adhesive is applied in or on the bonding surface (10) for bonding purposes. The height of the frames of the microframe structure (7) result in cavities (11) and channels (17) between the mount substrate (1) and the cover substrate (6). The functional elements (3) are located within the cavities (11), while the bonding elements (4) are located within the channels (17). The result is a multiplicity of functional elements (3), which are packaged at wafer level. FIG. 9.b is the illustration associated with FIG. 9.a, along the section line S9.

Separation of the Components:

The composite substrate is sawn up in the final method step. The composite substrate is sawn up by dicing the cover substrate (6) and by dicing the mount substrate (1), and can in this case be carried out in a single step, or in successive steps.

With reference to FIG. 10.a, the cover substrate (6) is opened along the trenches (9), as shown in FIG. 9.a, of the macrostructures on the vertical and horizontal paths by sawing with a saw width which corresponds to the width of the trenches (9). The opening of the macrostructure in one method step results in the bonding elements (4) being exposed through the opened area (14) in the cover substrate (6), and in each functional element (3) being surrounded by a package (13) in the area which has not been opened. FIG. 10.b is the illustration associated with FIG. 10.a, along the section line S10. FIG. 10.c is the illustration associated with FIG. 10.a, along the section line S11. With reference to FIG. 11.b, the mount substrate (1) is diced with a considerably narrower saw width in the opening area (14) of the mount substrate (1). The saw track is in this case predetermined by the splitting of the functional elements (3) and bonding elements (4) on the mount substrate, and preferably runs on straight lines, centrally within the grid strips (8). FIG. 11.b is the illustration associated with FIG. 11.a, along the section line S12.

FIG. 12 shows a packaged electronic component (15) with an integrated functional element (3), after the separation process.

In order to illustrate the different surface condition of the side surfaces (26, 27) of the cover substrate (6) or of the package (13), FIG. 13 shows an only partially separated composite substrate. The side surface (26, 27) or the side of the cover substrate (6) in the present illustration has a first side section (26) and a second side section (27).

The height of the first section (26) corresponds essentially to the depth of the macrostructure or of the trenches (9), with the first section (26) merging or opening upwards into the upper face F3 of the cover substrate (6), and downwards into the second section (27). The second section (27) itself opens on its lower face into the lower face F2 of the cover substrate (6), with its height corresponding essentially to the height of the cover substrate (6) in the area of the microstructure, minus the depth of the macrostructure.

In the second section (27), grooves, deep grooves or even scores can be formed in the side surface of the cover substrate (6) or of the package (13) while being separated by means of sawing, and these can be particularly disadvantageous for optical applications. The surface condition of the first side section (26) results, in contrast, from the method which is used to introduce the macrostructure or trenches (9), for example lapping. In a corresponding manner, the first section (26) and the second section (27) have a different surface condition. In particular, the first section (26) has a better surface condition at least than the second section (27). In the present example, the surface of the first section (26) is smoother than that of the second section (27). The first section (26) is less rough, for example in accordance with DIN 4768-1, than the second section (27). It is particularly advantageous for the first section (26) to have a smooth surface when the first section (26) opens into the upper face F3 of the cover substrate (6) and the functional element (3) is an optically active functional element. The first section (26) is distinguished, at least in comparison to the second section (27), by better imaging characteristics, thus making it possible to detect even objects in a laterally offset position.

Variants:

In addition to the described exemplary embodiment, a multiplicity of further variants are possible, some of which will be described by way of example in the following text.

As shown in FIG. 14, before the mount substrate (1) and cover substrate (6) are joined together, the bonding elements (6) can be coated with a temporary protective layer (16). The protective layer (16) prevents the dust and dirt particles created during the sawing process from contaminating the bonding elements (4), and thus being able to have an adverse effect on their functionality. In order to expose the bonding elements (4), the protective layer (16) is removed again once the wafer has been diced, for example by means of etching.

A further embodiment as shown in FIG. 15 may also comprise the use of a different "sawing method", which can lead to a different edge shape, for example in this case a rectangular edge shape, for the package (13).

FIG. 16 shows yet another exemplary embodiment, in which trenches (9) are produced both on the upper face F3 and on the lower face F2 of the cover substrate (6), for macrostructuring.

A further embodiment within the meaning of FIG. 17 could also comprise the upper face F1 of the mount substrate (1) with the microframe structure (7), and the lower face F2 of the cover substrate (6), being untreated with only the upper face F3 of the cover substrate (6) having a macrostructure.

FIG. 18 shows a further embodiment in which the macrostructure is in the present case introduced only into the lower face of the cover substrate (6).

FIG. 19 shows a packaged electronic component (15) with bonding elements (4) with which contact is made via the connections (5) and which are located outside the cavity (11). The bonding elements are in the form of bonding elements (4) which can be soldered, by means of which a wire (19) can be fitted, by soldering, in order to make contact with further parts which are not illustrated in the drawing.

FIG. 20 shows a packaged electronic component (15) which is arranged on the lower face of the mount substrate (1) by means of an adhesive-bonded or soldered joint (20), on a heat-dissipating base substrate (21).

In a further embodiment, FIG. 21 shows a packaged electronic component (15) with bonding elements (4) which are located outside the cavity (11) and with which contact is made via the connections (5). Solder bumps (22) are fitted to the bonding elements (4) and are advantageously composed of tin. A self-adjusting, finely-centered arrangement of the substrates (1, 23) with respect to one another is produced on connection to a base substrate (23), on which bonding pads (4) are likewise fitted, which are located in a corresponding arrangement, positioned with high precision, with respect to the bonding pads (4) on the mount substrate (1), by means of a reflow technique, in which the solder bumps are heated and melted on.

FIG. 22 shows a detail of an optical assembly with a packaged electronic component (15), which is arranged opposite an optical part (25), for example a lens. The optical part (25) is attached to the base substrate (23) by a suitable holder (24).

The electronic component (15) is likewise attached to the base substrate (23). As already described, the connection has been produced by means of a reflow technique. The optical part (25) and the optical sensor (3) are therefore arranged such that they are adjusted and are centered extremely accurately with respect to one another. The very dense arrangement of the lens with respect to the optical sensor (3) also allows better resolution of an optical signal.

It is clear to a person skilled in the art that the embodiments described above should be understood as examples, and that the invention is not restricted to them but can be varied in many ways without departing from the spirit of the invention.

LIST OF REFERENCE SYMBOLS

1 Mount substrate
2 Grid area
3 Functional element
4 Bonding element
5 Connecting contact (between a functional element and a bonding element)
6 Cover substrate
7 Microframe structure
8 Grid strip
9 Trench (on the upper face F3 of the cover substrate)
10 Bonding area, bonding pad
11 Cavity
12 Opening area of the cover substrate
13 Package
14 Opening area of the mount substrate
15 Individual component
16 Protective layer on the bonding elements
17 Channel
18 Trench (on the lower face F2 of the cover substrate)
19 Wire
20 Adhesive/solder joint
21 Heat-dissipating base substrate
22 Solder bumps
23 Base substrate
24 Holder
25 Optical part, lens
26 First side section of the cover substrate
27 Second side section of the cover substrate
Z Enlarged detail area of the mount substrate
F1 Upper face of the mount substrate
F2 Lower face of the cover substrate
F3 Upper face of the cover substrate
F1 Upper face of the mount substrate
F2 Lower face of the cover substrate
F3 Upper face of the cover substrate
S1 Section line mount substrate
S2 Section line mount substrate
S3 Section line mount substrate
S4 Section line mount substrate
S5 Section line cover substrate
S6 Section line cover substrate
S7 Section line cover substrate
S8 Section line cover substrate
S9 Section line composite substrate
S10 Section line composite substrate
S11 Section line composite substrate
S12 Section line composite substrate

The invention claimed is:

1. A method for production of packaged electronic components (15) having integrated functional elements (3), comprising:
    a) providing a mount substrate (1) and a cover substrate (6);
    b) fitting the functional elements (3) to the mount substrate (1) within predetermined grid areas (2);
    c) fitting bonding elements (4) to the mount substrate (1) within predetermined grid strips (8) which run between the grid areas (2), wherein the grid areas (2) and the grid strips (8) are arranged within a predetermined grid system formed by markings or masks on the mount substrate (1) or by a positioning process for the functional elements (3) corresponding to an imaginary grid on the mount substrate, and producing connecting contacts (5) between the functional elements (3) and the bonding elements (4);
    d) fitting a microframe structure (7) composed of glass with a height of 3 to 10 µm to the lower face of the cover substrate (6) and/or to the upper face of the mount substrate (1), with cavities (11) being produced corresponding to the grid areas (2), and with channels (17) being produced corresponding to the grid strips (8);
    e) introducing a macrostructure (8, 9) at least on the upper face of the cover substrate (6) or at least on the lower face of the cover substrate (6) by removal of surface areas, with trenches (9) being produced corresponding to the grid strips (8) on the mount substrate (1);
    f) joining together the mount substrate (1) and cover substrate (6) to form a composite substrate, with the functional elements (3) being packaged; and
    g) splitting the composite substrate along a predetermined track within the grid strips (8), with the composite substrate being broken up into individual components (15), and with the bonding elements (4) of the separated components (15) being exposed at the same time.

2. The method as claimed in claim 1, characterized in that a semiconductor wafer is provided as the mount substrate (1).

3. The method as claimed in claim 2, characterized in that a semiconductor wafer composed of silicon is provided as the mount substrate (1).

4. The method as claimed in claim 1, characterized in that the fitting of the functional elements (3) comprises the fitting of active semiconductor functional elements (3).

5. The method as claimed in claim 1, characterized in that the fitting of the functional elements (3) comprises the fitting of active-sensor functional elements (3).

6. The method as claimed in claim 1, characterized in that the fitting of the functional elements (3) comprises the fitting of optically active functional elements (3).

7. The method as claimed in claim 6, characterized in that a flat glass pane with a thickness of 500 to 1000 µm is provided as the cover substrate (6).

8. The method as claimed in claim 1, characterized in that a flat semiconductor, plastic, ceramic or metallic wafer with a thickness of 500 to 1000 µm is provided as the cover substrate (6).

9. The method as claimed in claim 1, characterized in that the frame webs of the microframe structure (7) are applied with a width of 1 to 500 µm.

10. The method as claimed in claim 1, characterized in that the fitting of the microframe structure (7) comprises:
    fitting a mask which provides a negative image of the microframe structure (7);
    vapor-depositing a glass layer; and
    removing the mask by means of a lift-off technique.

11. The method as claimed in claim 1, characterized in that the trenches (9) are introduced in the macrostructure with a width of 5 to 1000 µm.

12. The method as claimed in claim 11, characterized in that a macrostructure is introduced by removal of surface areas of the cover substrate (6) by means of etching, sandblasting or ultrasound oscillation lapping.

13. The method as claimed in claim 1, characterized in that the thickness of the cover substrate (6) is reduced by 10 to 80% in the area of the trenches (9) in the macrostructure.

14. The method as claimed in claim 1, characterized in that the trenches (9) are introduced on the upper face and lower face of the cover substrate (6).

15. The method as claimed in claim 1, characterized in that the microframe structure (7) is fitted to the lower face of the cover substrate (6).

16. The method as claimed in claim 15, characterized in that an adhesive layer is applied to the microframe structure (7), and the upper face of the mount substrate (1) is adhesively bonded to the microframe structure (7) on the lower face of the cover substrate (6), to form a composite substrate.

17. The method as claimed in claim 1, characterized in that the microframe structure (7) is fitted to the upper face of the mount substrate (1).

18. The method as claimed in claim 17, characterized in that the microframe structure (7) on the upper face of the mount substrate (1) is joined to the lower face of the cover substrate (6) by means of anodic bonding, fusion bonding, sol-gel bonding, low-temperature bonding, soldering or adhesive bonding to form a composite substrate.

19. The method as claimed in claim 1, characterized in that the composite substrate is broken up by exposure of the channels (17) along the trenches (9) on the cover substrate (6), and by splitting the mount substrate (1) along the predetermined track, which runs centrally in the channels (17).

20. The method as claimed in claim 19, characterized in that the channels (17) are exposed by sawing, sandblasting or ultrasound oscillation lapping of the cover substrate (6) along the trenches (9).

21. The method as claimed in claim 19, characterized in that the mount substrate (1) is split by sawing.

\* \* \* \* \*